United States Patent [19]

Mircea et al.

[11] Patent Number: 4,936,781

[45] Date of Patent: Jun. 26, 1990

[54] METHOD OF FABRICATION OF A P+NN+ DIODE AND OF A BIPOLAR TRANSISTOR INCORPORATING THIS DIODE UTILIZING THE EFFECT OF NEUTRALIZATION OF DONOR ATOMS BY ATOMIC HYDROGEN

[75] Inventors: Andrei Mircea, Yerres; Jacques Chevallier, Maurepas, both of France

[73] Assignee: Centre National d'Etudes des Telecommunications, Paris, France

[21] Appl. No.: 393,344

[22] Filed: Aug. 14, 1989

Related U.S. Application Data

[63] Continuation of Ser. No. 105,720, Oct. 6, 1987, abandoned.

[30] Foreign Application Priority Data

Oct. 6, 1986 [FR] France .................. 86 13885

[51] Int. Cl.$^5$ .................. H01L 21/329; H01L 21/331
[52] U.S. Cl. .......................... 437/24; 437/22; 437/31; 437/133; 437/937; 437/904
[58] Field of Search ............. 437/22, 24, 733, 741, 437/937, 31, 32, 33, 5, 6, 7, 904

[56] References Cited

U.S. PATENT DOCUMENTS

| | | | |
|---|---|---|---|
| 4,315,782 | 2/1982 | Tarng | 437/22 |
| 4,584,028 | 4/1986 | Pankove et al. | 437/24 |
| 4,610,731 | 9/1986 | Chevallier et al. | 148/DIG. 84 |
| 4,728,616 | 9/1988 | Ankri et al. | 437/133 |
| 4,751,195 | 6/1988 | Kawai | 437/133 |

FOREIGN PATENT DOCUMENTS

| | | |
|---|---|---|
| 0054648 | 6/1982 | European Pat. Off. |
| 0081414 | 6/1983 | European Pat. Off. |
| 0184016 | 6/1986 | European Pat. Off. |

OTHER PUBLICATIONS

Dautremont-Smith, et al., *Appl. Phys. Lett.*, 49(17), 27 Oct. 1986, pp. 1098–1100.
Bhattacharya, *J. Appl. Phys.*, 54(9), Sep. 1983, pp. 5039–5042.
Ankri, et al., *Physicia* 129B, 1985, pp. 361–365.
Malik, et al., *Appl. Phys. Lett.*, 46(6), 15 Mar. 1985, pp. 600–602.
Foyt, et al., *Solid-State Electronics*, Dergamon Dren, 1969, vol. 12, pp. 209–214.
Ghandhi, *VLSI Fabrication Principles*, John Wiley & Sons, 1983, pp. 420–423, 534–548.
Jalil, et al., *J. Appl. Phys.*, 59(11), 1 Jun. 1986, pp. 3774–3777.
Jalil, et al., *Appl. Phys. Lett.*, 50(8), 23 Feb. 1987, pp. 439–441.
Pajot, et al., *Physical Review B*, 37(8), 15 Mar. 1988, pp. 4188–4195.
Asbeck, et al., *IEEE Electron Device Letters*, vol. EDL-5, No. 8, Aug. 1984, pp. 310–312.
Ohshima, et al., *GaAS IC Symposium-Technical Digest 1985*, pp. 53–56.
Yuba, et al., Proceedings 13th Int. Conf. on Defects in Semiconductors, Aug. 12–17, 1984, Coronado, pp. 973–979.

*Primary Examiner*—Brian E. Hearn
*Assistant Examiner*—T. N. Quach
*Attorney, Agent, or Firm*—Nutter, McClennen & Fish

[57] ABSTRACT

A method of fabrication of a p+nn+ diode and a bipolar transistor which incorporates this diode, uitilizing the effect of neutralization of donor atoms by atomic hydrogen consists in forming a layer of Group III-Group V material of n+ type on a substrate of Group III-Group V material, locally implanting acceptor ions with a view to forming, in the surface, the p+ region of the diode adjacent to an intermediary n+ region forming two metal contacts at the surface of the layer of Group III-Group V material situated in proximity to one another and with respect to the p+ and n+ regions of the diode, the portion of the intermediary n+ region contiguous with the p+ region being without of metal contact, and hydrogenating the structure, to form in that portion an n region, with the other portion of the intermediary region being provided with a metal contact being constituting the n+ region of the p+nn+ diode.

8 Claims, 3 Drawing Sheets

METHOD OF FABRICATION OF A P+NN+ DIODE AND OF A BIPOLAR TRANSISTOR INCORPORATING THIS DIODE UTILIZING THE EFFECT OF NEUTRALIZATION OF DONOR ATOMS BY ATOMIC HYDROGEN

This application is a continuation of application Ser. No. 105,720, filed Oct. 6, 1987, now abandoned.

The present invention has as its object the fabrication of a p+nn+ diode within a substrate of Group III-Group V material utilizing the effect of neutralization of donors by atomic hydrogen.

It is applicable in particular in the domain of fabrication of ultrarapid semiconductor components intended for microelectronics and hyperfrequencies, and more particularly in the domain of bipolar homojunction and heterojunction transistors utilizable principally in telemetry, integrated optics, or in fiber optic telecommunications. In these bipolar transistors, the p+nn+ diode constitutes the emitter and the base.

In a more precise fashion, the invention deals with the fabrication of a lateral p+nn+ diode having extremely reduced dimensions. A lateral diode is a diode whose p+nn+ regions are aligned in the same plane, parallel to the surface of the substrate.

In FIG. 1, represented schematically in longitudinal section, is a lateral diode of Group III-Group V material. This diode incorporates, on the surface of a substrate 2 of semi-insulating Group III-Group V material of type n, a region 4 of type p+, and a region 6 of type n+, each bearing a metal contact 8 and 10 respectively.

The two regions of type p+ and n+ diffused or implanted in the substrate 2 are separated by a less conductive region 12, generally of the n or p type, but not strictly insulating, of length L, L being very small (of the order of 1 to 10 micrometers), but not zero.

In essence, if this length L is too great, the commutation time of the diode increases, due to the diffusion of carriers in this region occurring over too great a distance. On the other hand, if this distance L is zero, the current/voltage characteristics of the diode are degraded, because the current may pass equally easily in both directions, by the Tunnel Effect.

The method of fabrication of a p+nn+ diode of the foregoing kind is illustrated in schematic fashion in FIG. 2.

Currently, the type n region 12 of the diode is implemented by epitaxy on the substrate 2 of Group III-Group V material, and the region 6 of type n+ is also implemented by epitaxy, or possibly by ion implantation, in the layer 12 of type n. The maximum level of active doping utilized for the region 6 of type n+ is between 1 and $5 \times 10^{18}$ at/cm$^3$.

The region 4 of type p+ is subsequently implemented by ion implantation, with a level of active doping generally greater than $10^{19}$ at/cm$^3$, thus widely exceeding that of the region 6 of type n+.

At this stage of fabrication, the regions 4 and 6 are adjacent, as shown in FIG. 2. Consequently, the current/voltage characteristic is poor.

There is thus effected a partial masking of the surface of the structure with a resin 14, leaving uncovered only a zone 16 of very small width, aligned and centered on the edge 17 of the implanted region 4 of type p+ adjacent to the n+ region 6. Thereupon an attack treatment is conducted, of the zone 16 of non-masked Group III-Group V material, by a humid or plasma vehicle, so as to remove this entire highly doped region (n+ or p+ or both).

After elimination of the resin mask 14, metal contacts 8 and 10 are formed, on the respective p+ and n+ regions of the diode. For this, there is again recourse to masking operations, defining the image of the contacts to be implemented, then to deposition of a metallic layer, etc. In these operations, it is imperative to align the masks used for implementation of the contacts with the mask 14 utilized before for the attack treatment, so as not to cover again with metal the attacked region 16, but only the regions of p+ and n+ type.

The surface of the p+nn+ diode resulting from the foregoing chemical or plasma attack is no longer planar, causing a difficulty in subsequent cleaning and passivization, as well as problems of alignment and implementation of the metal contacts in the p+ and n+ regions of the diode.

Moreover, it is necessary to position the attack mask 14 very precisely at the periphery of the implanted p+ region. This results in a low manufacturing yield, and also means that the region 16 to be attacked must be very narrow.

Furthermore, the rate of attack of this highly doped region must be calibrated in a very precise manner, in order to avoid an attack in depth of the subjacent n region, extending to the substrate 2, leading to a p+nn+ diode which may no longer conduct at all.

In this particular case of emitter/base diodes of bipolar transistors, the risk is that of cutting the base of the transistor from its external contact.

One of the techniques utilized to achieve good p-n junctions between the base and emitter of a bipolar transistor has been described in particular in the article by D. ANKRI et al., appearing in Physica 129B (1985), pp. 361-365, entitled "Design and fabrication process of GaAs-GaAlAs ECL inverters." In this document, the n+ region of the emitter is removed by chemical attack on the entire surface of the structure, except the emplacement of the emitter contact.

This technique presents very serious limitations on the level of miniaturization of transistors, taking into account the problems linked with correct positioning of the etching mask utilized to form the n+ region with respect to the contacts of the base and the emitter.

A second technique currently utilized to achieve good p-n juctions between the base and emitter of a bipolar transistor is described in the document by R. J. MALIK et al., appearing in Appl. Phys. Lett. 46 (6), Mar. 15, 1985, pp. 600-602, entitled "High gain high frequency AlGaAs/BaAs graded band-gap base bipolar transistors with Be diffusion setback layer in the base."

This technique is superior to the preceding one; it consists of removing solely the n+ region situated between the emitter and the base. All the same, the structure obtained after chemical attack is no longer planar, causing as before, difficulties in subsequent cleaning and passivization, as well as in providing metal contacts for the emitter on the base.

In addition, it is familiar from the document Appl. Phys. Lett. 47 (2), July 15, 1985, pp. 108-110, entitled "Donor neutralization in GaAs (Si) by atomic hydrogen," by J. CHEVALLIER et al., to neutralize from the electrical point of view the donor atoms (Si) of a substrate of GaAs with atomic hydrogen.

The present invention has precisely as its object a method of fabrication of a p+nn+ diode enabling remediation of the various drawbacks described above, by eliminating in particular the above stage of chemical or plasma attack.

In a more precise fashion, the invention has as its object a method of fabrication of a p+nn+ diode in a semiconductor substrate of Group III-Group V material, incorporating a region of type p+, a region of type n, and a region of type n+, which is unique in that it incorporates the following stages:

formation of a layer of Group III-Group V material of type n+ on the surface of the substrate;

local implantation of acceptor ions in the layer of Group III-Group V material to form in the surface a region of type p+ of the diode adjacent to an intermediary region of type n+;

the providing of two metal contacts on the surface of the layer of Group 111-Group V material, in proximity to one another, and respectively opposite the region of type p+ and the intermediary region of type n+, with a portion of this intermediary region contiguous to the region of type p+ being deprived of metal contact, and the other portion of this intermediary region bearing a metal contact, corresponding to the type n+ region of the diode, and hydrogenation of the structure to form a region of type n in the portion of the intermediary region without metal contact, with the metal contacts serving as a mask for this hydrogenation.

As a substrate, it is necessary to include the possibility both of a block substrate, and a layer deposited on a block substrate or on a stack of other layers.

The replacement of a chemical attack with a hydrogenation stage enables a planar structure to be attained, thus facilitating the implementation of metal contacts in the type p+ and type n+ regions of the diode.

This hydrogenation treatment, as described in the above article by J. CHEVALLIER, enables neutralization from the electrical point of view, of the donor atoms of the n+ region, so that the semiconductor in this region becomes of type n instead of type n+, with a concentration of carriers typically between $10^{16}$ and $5 \times 10^{16}$ carriers/cm$^3$, while the initial concentration of carriers is some $10^{18}$/cm$^3$.

The n+ region protected by the corresponding metal contact is in no way affected by this hydrogenation.

The inventors perceived in a surprising fashion that electrical neutralization is different from electrical compensation, generally obtained by ion bombardment (with protons, for example). Tn effect, electrical neutralization leads to an increase in the mobility of carriers, the inverse of the effect of electrical compensation, as is illustrated in the document J. Appl. Phys., vol. 59, no. 11 of June 1, 1986, pp. 3774-3777, entitled "Electron Mobility Studies Of The Donor Neutralization By Atomic Hydrogen In GaAs Doped With Silicon", by JALIL, CHEVALLIER, AZOULAY and MIRCEA. This neutralization thus enables a rapidly functioning diode to be obtained.

By aid of the method according to the invention, by auto-alignment or auto-positioning, there forms around the metal contacts of the n+ and p+ regions, a region of type n, and consequently, a p+nn+ diode which has the desired electrical characteristics.

In particular, this auto-alignment of the n region with respect to the metal contacts of the p+ and n+ regions, minimizes the commutation time of the diode by a simultaneous optimization of the series resistances of the p+, n and n+ regions and of the length of diffusion of carriers in the n region, promoting a faster functioning diode.

Moreover, the method according to the invention is easy to implement. In particular, the parameters of the hydrogenation stage, notably its duration, are in no way critical.

In advantageous fashion, the hydrogenation is implemented by subjecting the structure to a hydrogen plasma.

According to a first form of implementation of the method according to the invention, the following stages are conducted in succession:

formation of the layer of Group III-Group V material;

deposition of an insulating layer on the layer of Group III-Group V material;

formation of a first resin mask on the insulating layer, representing the image of the region of type p+ of the diode to be implemented;

elimination of the regions of the insulating layer not masked by the first mask;

implantation of acceptor ions into the layer of Group III-Group V material, through the first resin mask, to form the region of type p+ of the diode;

deposition of a first metal layer on the first resin mask;

elimination of the first resin mask, resulting in the formation of the metal contact of the p+ region of the diode;

formation of a second mask on the structure obtained, representing the image of the region of type n+ of the diode to be implemented;

elimination of the region of the insulating layer not masked by the second mask;

deposition of a second metal layer on the second resin mask;

elimination of the second resin mask, resulting in the formation of the metal contact of the region of type n+ of the diode to be implemented;

annealing of the structure;

elimination of the remainder of the insulating layer, and hydrogenation of the structure to form the region of type n of the diode between the regions of type p+ and type n+ of the diode.

This first form of implementation is utilizable with first and second metal layers of refractory material not subject to any damage during annealing of the structure.

For the formation of metal contacts in the n+ and p+ regions of the diode when non-refractory, it is preferred to utilize a second mode of implementation of the method according to the invention, incorporating the following stages:

formation of the layer of Group III-Group V material;

deposition of an insulating layer on the layer of Group III-Group V material;

formation of a first resin mask on the insulating layer, representing the image of the region of type p+ of the diode to be implemented;

elimination of the regions of the insulating layer not masked by the first mask;

implantation of acceptor ions into the layer of Group III-Group V material, through the first resin mask, to form the region of type p+ of the diode;

elimination of the first resin mask;

deposition of a second insulating layer on the structure obtained;

annealing of the structure to electrically activate the implanted acceptor ions;

formation of a second mask on the structure obtained, representing the image of the region of type n+ of the diode to be implemented;

elimination of the regions of the first and second insulating layers not masked by the second mask;

deposition of a first metal layer on the second resin mask;

elimination of the second resin mask, resulting in the formation of the metal contact of the region of type n+ of the diode to be implemented;

deposition of a third mask on the structure, identical to the first mask;

elimination of the regions of the first and second insulating layers not masked by the third mask;

deposition of a second metal layer on the third resin mask;

elimination of the third resin mask, resulting in the formation of the metal contact of the region of type p+ of the diode to be implemented;

annealing of the structure;

elimination of the remainder of the first and second insulating layers, and hydrogenation of the structure to form the region of type n of the diode.

The layer of Group III-Group V material of type n+ can be formed on the surface of the substrate either by implantation of donor ions such as ions of silicon, selenium or germanium, or by epitaxy by molecular jet or vapor phase.

In order to enable hydrogenation all the way to the substrate, the thickness of the layer of Group III-Group V material must be less than 1 μm.

The invention is applicable to any type of Group III-Group V material. In fact, the layer of type n+ and the substrate, which may be identical or different, can be implemented of InP, GaAs, GaSb, InAs, InSb, $Ga_{1-x}Al_xAs$, $Ga^{1-x}In_xAs$, $Ga_{1-x}In_xAs_{1-y}P_y$, $Al_{1-x}In_xAs$ or $Ga_{1-x-y}Al_xIn_yAs$, wherein $0 < x \leq 1$ and $0 < y \leq 1$.

The above method of diode fabrication is advantageously applicable to the realization of emitter/base diodes of homojunction or heterojunction bipolar transistors, notably of the GaAs, GaAs/GaAlAs or GaInAs/InP types.

To this end, the invention has further as its object a method of fabrication of a bipolar transistor of Group III-Group V material incorporating a p+nn+ diode between the base and the emitter, unique in that it includes the following stages:

deposition of a first layer of Group III-Group V material of type n on a substrate of Group III-Group V material, constituting the collector of the transistor;

deposition of a second layer of Group III-Group V material of type p on the first layer of Group III-Group V material, constituting the base of the transistor;

deposition of a third layer of Group III-Group V material of type n on the second layer of Group III-Group V material, constituting the emitter of the transistor;

formation of a fourth layer of Group III-Group V material of type n+ on the surface of the third layer of Group III-Group V material, serving for electrical contact to the emitter;

local implantation of acceptor ions in the third and fourth layers of Group III-Group V material to form the region of type p+ of the diode, adjacent to an intermediate region of type n+, and extending in depth only to the second layer of Group III-Group V material;

formation of two metal contacts on the surface of the fourth layer of Group III-Group V material, situated in proximity of one another, and respectively opposite the region of type p+ and the intermediate region of type n+, with one portion of this intermediate region, contiguous to the region of type p+, being without metal contact, and the other portion of this intermediate region, bearing a metal contact, corresponding to the region of type n+ of the diode, and hydrogenation of the structure to form a region of the type n within the portion of the intermediate region deprived of metal contact, with the metal contacts serving as masks in this hydrogenation.

Other characteristics and advantages of the invention will be made clearer by the description which follows, meant to be illustrational, but not limitational.

BRIEF DESCRIPTION OF THE DRAWINGS

The description refers to the appended diagrams, in which.

DESCRIPTION OF THE PREFERRED EMBODIMENTS

The description below refers to the fabrication of a p+nn+ diode implemented in a substrate of GaAs. However, as has already been seen, other substrates of Group III-Group V materials may be envisioned.

Figure 1:
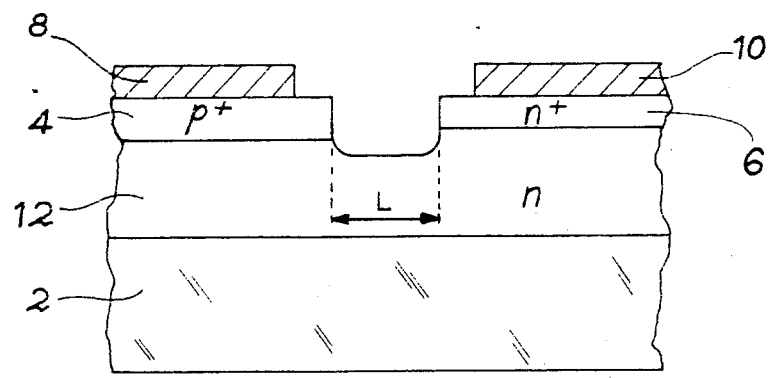
FIG. 1, already described, represents schematically, in longitudinal section, a p+nn+ diode according to the prior art.
Figure 2:
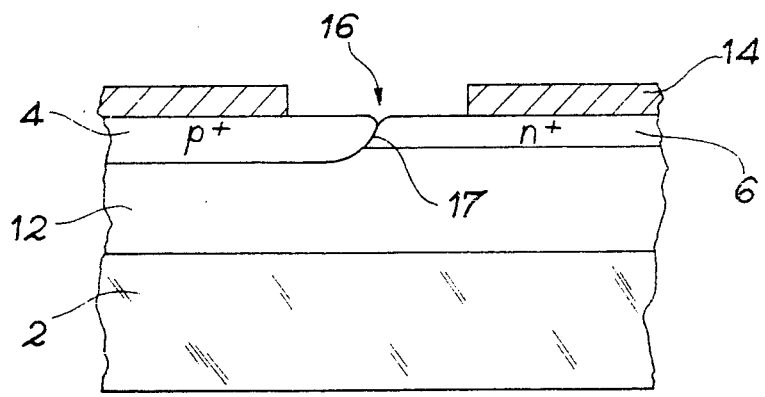
FIG. 2, already described, illustrates schematically, in longitudinal section, the process of implementation of the p+nn+ diode of FIG. 1.
Figure 3:
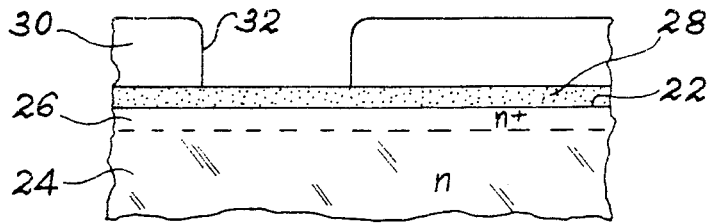
FIGS. 3 to 7 illustrate, schematically in longitudinal section, a first form of implementation of the method of fabrication according to the invention.

The first stage of the method consists of chemically polishing the surface 22 of a semi-insulating substrate 24 of GaAs of type n, as represented in FIG. 3, by an inorganic solvent such as $H_2SO_4 + H_2)_2 + H_2$). Then, on the surface of the substrate 24, is formed a layer 26 of GaAs of type n+, by implanting donor ions in the surface of the said substrate. This implantation is realized in particular with ions of silicon with a dosing of $5 \times 10^{14}$ at/cm$^2$ and an energy of 190 keV, to form a layer 26 of type n+, with a thickness on the order of 200 nm.

Then, there is conducted an annealing of the structure, in order to electrically activate the implanted donor ions. This annealing is realized, in particular, at 850° C. for 30 minutes in an arsine atmosphere.

Of course, it is possible to replace the stages of polishing, implantation and annealing by epitaxy by molecular jet or vapor phase of a layer of GaAs of the n+ type on the surface 22 of the substrate 24, of 200 nm.

Onto the surface 26 of type n+ is then deposited by plasma assisted chemical vapor phase deposition (PACVD), an insulating layer 28 of approximately 200 nm. This insulating layer can be realized in silicon nitride ($Si_3N_4$) or silicon oxide $SiO_2$).

On the insulating layer 28 is then formed, by classical processes of photolithography, a resin mask 30 representing the image of the region of type p+ of the diode to be implemented. In particular, this resin mask 30 includes an opening 32.

Figure 4:
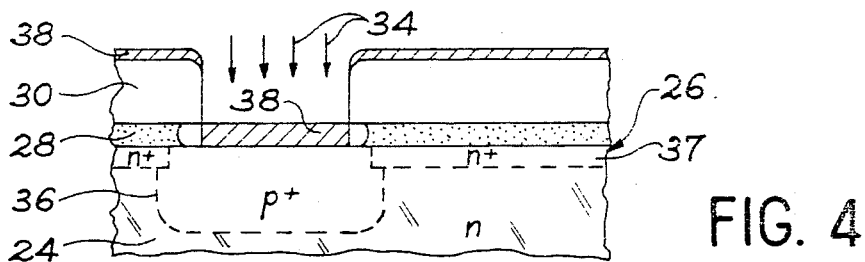

Through this resin mask 30, as represented in FIG. 4, is effected an etching of the insulating layer 28, consisting of eliminating the non-masked region of this layer. This etching may be realized in an isotropic manner by plasma etching using as the attacking agent $CF_4$ or $CHF_3$, or by chemical attack utilizing a buffered solution of hydrofluoric acid.

There is then effected an ion implantation 34 of acceptor ions, in the regions of the layer 26 of type n+ and of the substrate 24, not covered by insulation 28 or resin 30. This ionic implantation enables a region 36 of type p+ to be obtained, adjacent to a region 37 of type n+, the said intermediate region, and centered with respect to the opening 32 of the resin mask 30.

This implantation is realized using Mg+ ions with a dosing of $9 \times 10^{14}$ at/cm$^2$ and an energy of 350 keV, leading to the creation of a region 36 of approximately 500 nm thickness. This ion implantation may be followed by a second implantation of Mg+ ions with a dosing of $6.10^{13}$ at/cm$^2$ and an energy of 30 keV, thus ensuring a good electrical conductivity in the surface of the region 36.

The next stage of the method consists of depositing on the structure, i.e. on the mask 30 and the type p+ region 36, a first conducting layer 38 of about 300 nm. This layer 38 is realized of refractory material such as a multilayer material of titanium and gold deposited by evaporation under vacuum.

Figure 5:
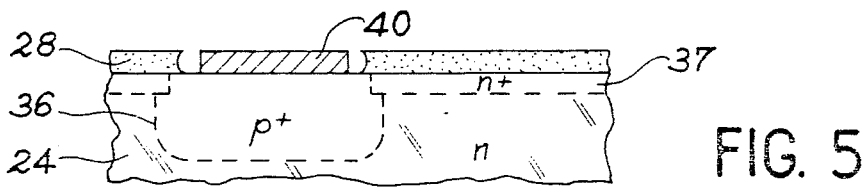

Then the resin mask 30 is eliminated, by dissolving in a ketone, thus resulting in the elimination of the conductor material 38 on top of the resin. This technique is familiar under the term "lift off." The structure obtained is that represented in FIG. 5.

In this figure, the metal contact of the region 36 of type p+ obtained bears the designation 40. It is auto-positioned on the p+ region, given that the metal contact 40 and the implanted p+ zone are realized using the same resin mask 30.

Figure 6:
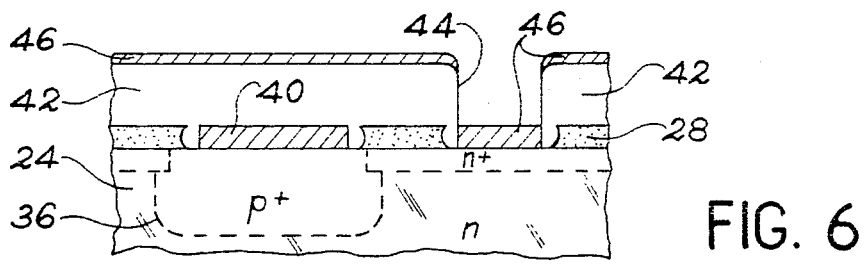

The next stage of the method consists of forming a second resin mask 42, as represented in FIG. 6, representing the image of the region of type n+ of the diode to be created. To this end, the resin mask 42, implemented according to classical photolithographic processes, incorporates an opening 44.

Next, the regions of the insulating layer 28 not covered by the resin 42 are eliminated. This is done by isotropic plasma engraving, using as the attack agent $CF_4$ or $CHF_3$, or by chemical attack with a buffered hydrofluoric acid.

On the resin mask 42 and the type n+ region of the diode to be achieved, is then deposited by evaporation under vacuum a second conductive layer 46. This layer 46 is formed of refractory material, and in particular of a multilayer material of germanium, molybdenum, titanium and gold. This layer 46 has a thickness on the order of 300 nm.

Figure 7:
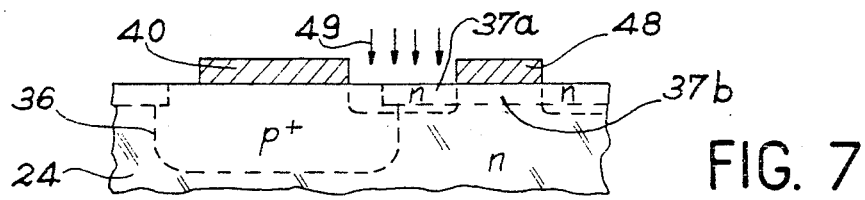

Then, the second resin mask 42 is eliminated by dissolving in a ketone in order, by "lift off," to acquire a metal contact 48 of the type n+ region to be implemented, as represented in FIG. 7.

There is then performed a thermal annealing of the structure for about 30 minutes under arsine at 800° C., in order to form alloys of the metal contacts 40 and 48 with the regions of type p+ and n+ of the diode, thus realizing ohmic contacts, and electrically activating the acceptor ions implanted to form the type p+ region 36.

Thereupon the remainder of the insulating layer 28 is eliminated, as seen in FIG. 7, by chemical attack with buffered HF.

The last stage of the method consists of subjecting the structure obtained to the action of a hydrogen plasma 49 for ½ hour to 1 hour, leading to the formation of a type n region 37a not covered by a metal contact, and auto-aligned with respect to the ohmic contacts 40 and 48. This type n region extends downward as far as the type n substrate 24. The ohmic contacts 40 and 48 serve as masks for this hydrogenation.

This hydrogenation enables the formation of the region 37a of type n by neutralization of the donor ions of the intermediate region 37 of type n+. The portion of the intermediate region 37 situated below the ohmic contact 48 constitutes the region 37b of type n+ of the p+nn+ diode.

The method described above in reference to FIGS. 3 to 7 can only be utilized for contacts 40 and 48 of a refractory material, i.e. of materials not undergoing any damage in the final annealing of the structure at 800° C.

Figure 8:
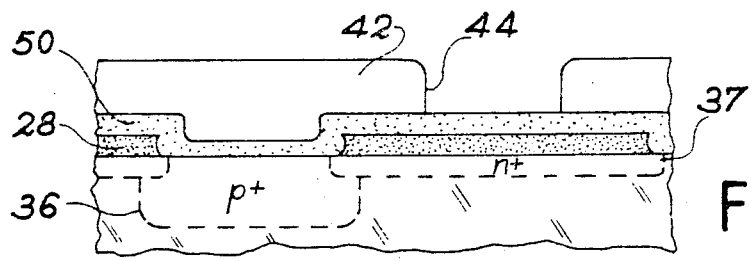
FIGS. 8 to 10 illustrate, schematically in longitudinal section, a second form of implementation of the method of fabrication according to the invention.
Figure 9:
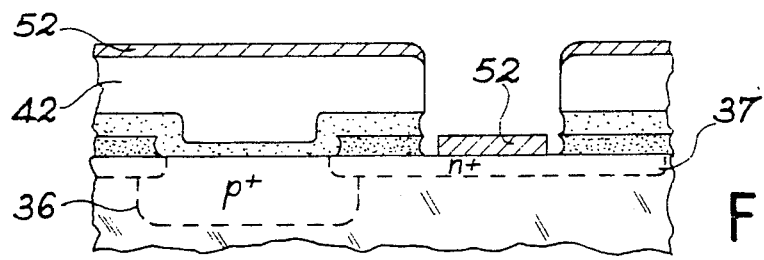
Figure 10:
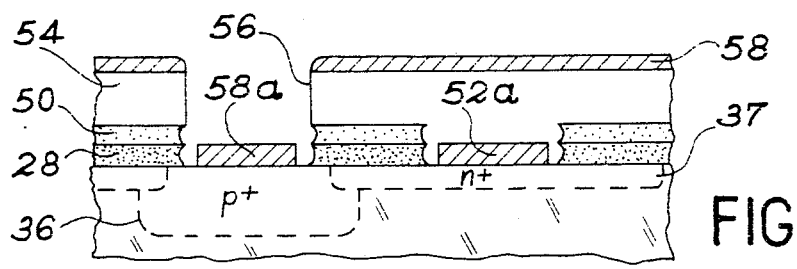

For the realization of non-refractory metal contacts, it is preferred to utilize the variation of the method which is represented in FIGS. 8 to 10.

This variation is distinguished from the method described above by the elimination of the resin mask 30 after formation of the type p+ region 36 of the diode, by implantation of acceptor ions in the substrate 24 and the type n+ layer 26.

After elimination of the resin mask 30, on the structure obtained, and in particular on the insulating layer 28 and on the implanted region 36, is deposited another layer of insulator 50, as represented in FIG. 8, by the technique of plasma assisted vapor phase chemical deposition, having a thickness of about 200 nm. This insulating layer is constituted of $Si_3N_4$ or $SiO_2$.

There is then performed a thermal annealing of the structure at a temperature of 800° C. for about 30 minutes under an arsine atmosphere, with a view to electrically activating the acceptor ions implanted in the formation of the region 36.

Then the second resin mask 42 is formed, representing the image of the type n+ region of the diode to be achieved. The mask 42 is formed by classical processes of photolithography.

Next, the regions of the insulating layers 28 and 50 which are not covered by the resin mask 42 are eliminated. This is achieved by an isotropic etching, for example by chemical attack with a buffered HF solution. The structure obtained is that which is represented in FIG. 9.

On the mask 42, and on the type n+ region of the diode to be achieved, is then deposited, by evaporation under vacuum, a conducting layer 52 constituted of non-refractory material. This layer 42 is constituted, for example, of a three-layer material of gold, germanium and nickel. It has a thickness on the order of 300 nm.

Thereafter, the resin mask 42 is eliminated by dissolving in a ketone, in order to bring about by "lift off"

the metal contact 52a of the type n+ region of the diode to be achieved, as represented in FIG. 10.

On the structure obtained is then formed a third resin mask 54, identical to the first mask 30 (FIG. 3), representing the image of the metal contact of the implanted region 36 to be achieved. In particular, this mask 54 incorporates an opening 56. It is realized by classical processes of photolithography.

There is then performed an etching of the insulating layer 50, consisting of eliminating the region of this layer not masked by the resin 54. This etching is achieved in isotropic fashion by chemical attack using an HF solution, for example.

Then a second metal layer 58 is deposited on the entire structure, in particular on the resin mask 54 and on the p+ region 36. This layer 58, constituted of a non-refractory material such as a two-layer material of gold and manganese, is deposited by evaporation under vacuum. This layer displays a thickness of about 300 nm.

Then the resin mask 54 is eliminated, by dissolving in a ketone, resulting in the formation of the metal contact 58a of the p+ region of the diode, by "lift off."

There is then performed a thermal annealing of the structure for about 3 minutes at 400° C., in order to form alloys of the metal contacts 52a and 58a. In particular, the metal contact 58a of the type p+ region is of AuMn, and that of the type n+ region is of AuGeNi.

The final stages of fabrication of the diode consisting of eliminating the remainder of the insulating layers 28 and 50, and hydrogenating the structure to form the region of type n, are identical to those described above in reference to FIG. 7.

Figure 11:
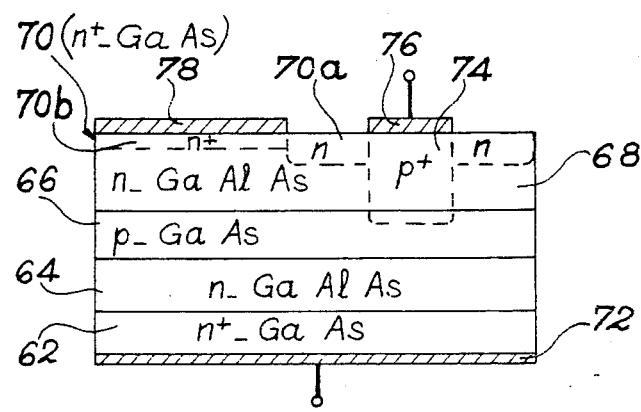
FIG. 11 represents schematically, in longitudinal section, a bipolar heterojunction transistor incorporating a p+nn+ diode, realized by the method according to the invention, between the base and emitter.

In FIG. 11 has been represented schematically a heterojunction bipolar transistor whose emitter includes a p+nn+ diode realized as described above in reference to FIGS. 3 to 10.

This transistor includes numerous layers formed by epitaxy by molecular jet or in vapor phase onto a semiconductor substrate 62 of GaAs of type n+, designated, proceeding outward from the substrate, as 64, 66, 68 and 70.

The layer 64 of $Ga_{1-x}Al_xAs$, with $0<x\leq 1$, of type n, constitutes the collector of the transistor. This layer, constituted, for example, of $Ga_{0.6}Al_{0.4}As$, has a thickness of 2 to 4 $\mu m$. The metal contact of the collector 64 is implemented by the conductive layer 72, notably of AuGeNi, of 500 nm.

The layer 66 of GaAs of type p, constitutes the base of the bipolar transistor. It has a thickness of 300 nm, and has upon it the layer 68 of $Ga_{1-x}Al_xAs$ of type n, constituting the emitter of the transistor. This layer 68 has, for example, a thickness of 1 $\mu m$, and is constituted of $Ga_{0.6}Al_{0.4}As$. The layer 70 is constituted of GaAs of type n+, and enables contact to the emitter 68. It measures about 700 nm.

Conforming to the invention (FIG. 3), there is created in the layers 68 and 70, an implanted region 74 of type p+, extending downward as far as the base 66 of the transistor. This region 74, which serves for contact to the base of the transistor, is formed by implanting Mg+ ions with a dosing of $10^{15}$ at/cm$^2$, and an energy of 400 keV (or beryllium), in order for this p+ region 74 to have a depth on the order of 1.8 Dm.

As described above (FIGS. 4, 5 or 10), upon this region 74 is then created the ohmic contact of the base 76. This contact of about 300 nm is formed in particular of AuMn.

The subsequent stages consist of forming, as described in FIGS. 6 to 9, the type n region 70a, and the type n+ region 70b, of the p+nn+ diode within the layer 70 providing for contact for the emitter of the transistor. Parallel to this (FIGS. 6 and 9) is formed the ohmic contact 78 of the region 70b of type n+ of the emitter of the transistor. This contact has a thickness of 300 nm, and is constituted notably of AuGeNi.

The description given above has of course been given solely by way of illustration, and all modifications may be envisioned, without thereby departing from the scope of the invention. In particular, the thickness, doping and composition of the various semiconductive layers of the diode and/or of the bipolar transistor may be modified.

We claim:

1. A manufacturing method for a p+nn+ diode placed within a crystalline semiconductor substrate (24, 68) composed of Group III-Group V material, which shall include a region of the p+ type (36) provided with a first metal contact (40, 58a, 76), a region of the n type (37a), and a region of the n+ type provided with a second metal contact (48, 52a, 78), said method comprising the following steps:

Epitaxy of a crystalline layer (26, 70) composed of Group III-Group V material of the n+ type, on the surface of the substrate (24, 68);

Localized implanting of acceptor ions in the layer (26, 70) composed of Group III-Group V material, so as to form a region of the p+ type (36, 74) upon the surface of the diode, adjacent to an intermediate region of the n+ type (37);

Completion of said first and second metal contacts (40, 48, 52a, 58a, 76, 78) upon the surface of the layer composed of Group III-Group V material (26, 70), with said contacts being positioned adjacent to one another and respectively opposite the type p+ region (36, 74) and the intermediately situated type n+ region (37), whereby a first portion (37a) of this intermediate region, contiguous to the type p+ (36, 74), does not contain a metal contact, and a second portion (37b, 70b) of said intermediate region (37) is coated with said second metal contact (48, 52a, 78), said second portion corresponding to the region of the n+ type within the respective diode;

Hydrogenation (49) of said crystalline layer with atomic hydrogen plasma for converting the conductivity $n_+$ of the first portion 37a of the intermediate region which does not contain a metal contact into a conductivity n so as to form a crystalline region of the n type (37a, 70a), whereby the first and second metal contacts (40, 48, 52a, 58a, 76, and 78) function as a mask for said hydrogenation.

2. A method according to claim 1, which includes the following successive steps:

Epitaxy of the layer (26, 70) composed of Group III-Group V material;

Depositing of an insulating layer (28) upon the layer composed of Group III-Group V material;

Formation of an initial resin mask (30) upon the insulating layer (28) so as to provide an image of the type p+ region (36, 74) of the diode which is to be produced subsequently;

Removal of regions within the insulating layer (30) which are not covered by the initial mask (30);

Implanting of acceptor ions within the layer composed of Group III-Group V material, through the initial resin mask (30), so as to form the type p+ region (36, 74) within the diode;

Depositing of a metal layer (38) upon the initial resin mask (30);

Removal of the initial resin mask (30), so as to allow formation of the metal contact (40, 76) for the type p+ region (36, 74) within the diode;

Formation of another resin mask (42) upon the respective structure, so as to provide an image of the type n+ region (37b, 70b) within the diode which is to be produced subsequently;

Removal of the portion of the insulating layer (28) which is not covered by the second mask (42);

Depositing of another metal layer (46) upon the second resin mask (42);

Removal of the second resin mask (42) so as to allow formation of the metal contact (48, 78) for the type n+ region (37b, 70b) which is to be produced subsequently;

Annealing of the respective structure;

Removal of the remainder of the insulating layer (28);

Hydrogenation (49) of the structure so as to form the type n region (37a, 70a) of the diode, between the type p+ (36, 74) and type n+ (37b, 70b) regions of said diode.

3. A method according to claim 1, which includes the following steps:

Expitaxy of a layer (26, 70) composed of Group III-Group V material;

Depositing of an initial insulating layer (28) upon said layer of Group III-Group V material;

Formation of an initial resin mask (30) upon the initial insulating layer (28) so as to provide an image of the type p+ region (36, 74) of the diode which is to be produced subsequently;

Removal of regions of the initial insulating layer (28) which are not covered by the initial mask (30);

Implanting of acceptor ions within the layer composed of Group III-Group V material, through the initial resin mask (30), so as to form the type p+ region (36, 74) of the diode;

Removal of the initial resin mask (30);

Depositing of another insulating layer (50) upon the structure;

Annealing of the structure in order to ensure electrical activation of implanted acceptor ions;

Formation of another mask (42) upon said structure so as to provide an image of the type n+ region (37b, 70b) of the diode which is to be produced subsequently;

Removal of regions within the first (28) and second (50) insulating layers where these regions are not covered by the second mask (42);

Depositing of an initial metal layer (52) upon the second resin mask (42);

Removal of the second resin mask (42) so as to obtain formation of the metal contact (52a, 70) for the type n+ region (37b, 70b) within the diode which is to be produced subsequently;

Depositing of a third mask (54) upon the respective structure, with this mask being identical to the initial mask (30);

Removal of the portion of the second insulating layer (50) which is not covered by the third mask (54);

Depositing of another metal layer (58) upon the third resin mask (56);

Removal of the third resin mask (54), so as to obtain formation of the metal contact (58a, 76) for the type p+ region (36, 74) of the diode.

Annealing of the structure;

Removal of the remaining portions of the first (28) and second (50) insulating layers;

Hydrogenation (49) of the structure so as to form the type n region (37a, 70a) of the diode between the type p+ (36, 74) and type n+ (37b, 70b) regions of said diode.

4. A method according to claim 1, wherein the substrate and/or the layer of Group III-Group V material shall be composed of GaAs, InP, $Ga_{1-x}Al_xAs$, or $Ga_{1-x}In_xAs$, with $0 < x \leq 1$.

5. A method according to claim 1, wherein the layer (26, 70) composed of Group III-Group V material possesses a thickness which is equal to 1 micron as a maximum.

6. A method according to claim 1, wherein the layer (26, 70) composed of Group III-Group V material is formed by molecular beam epitaxy or in a vapor phase.

7. A method according to claim 1, wherein the layer (26, 70) composed of Group III-Group V material is formed by implanting donor ions within the surface of teh substrate (24), with this ion implantation procedure followed by annealing.

8. A method of manufacturing a bipolar transistor composed of Group III-Group V material, which sall include a p+nn+ diode between the base and the emitter, said method comprising the following steps:

Epitaxy of an initial crystalline layer (64) of Group III-Group V material of the n type upon a crystalline substrate composed of Group III-Group V material (62), which shall consistute the collector within said transistor;

Epitaxy of another crystalline layer (66) of Group III-Group V material of the p type upon the first layer (64) of Group III-Group V material, with the second layer constituting the transistor base;

Epitaxy of a third crystalline layer (68) of Group III-Group V material of the n type upon the second layer (66) of Group III-Group V material, with the third layer constituting the transistor emitter;

Epitaxy of a fourth crystalline layer (70) of Group III-Group V material of the n+ type upon the surface of the third layer (68) of Group III-Group V material, with the fourth layer functioning as an electrical contact for the emitter;

Localized implanting of acceptor ions within the third and fourth layers composed of Group III-Group V material so as to provide the type p+ region (74) within the diode, adjacent to provide the type p+ region, according to a depth extending to the second layer (66) of Group III-Group V material;

Completion of two metal contacts (76, 78) on the surface of the fourth layer (70) of Group III-Group V material, with said contacts being positioned adjacent to one antoehr and respectively opposite the type p+ region and the intermediately situated type n+ region, whereby a first poriton (70a) of this intermediate region, contiguous to the type p+ region (47), does not contain a metal contact, and a second portion (70b) of said intermediate region is coated with a metal contact (78) said second portion corresponding to the region of the n+ type within the respective diode;

Hydrogenation (49) of said third and fourth layers with atomic hydrogen plasma for converting the conductivity n+ of the first portion (70a) of the intermediate region which does not contain a metal contact into a conductivity n so as to form a crystalline region of the n type (70a), whereby the metal contacts (76, 78) constitute a mask for said hydrogenation.

* * * * *